(12) United States Patent
Dai et al.

(10) Patent No.: US 6,677,189 B2
(45) Date of Patent: Jan. 13, 2004

(54) METHOD FOR FORMING POLYSILICON THIN FILM TRANSISTOR WITH A SELF-ALIGNED LDD STRUCTURE

(75) Inventors: Yuan-Tung Dai, Chung-Li (TW); Tsung-Neng Liao, Taichung Hsien (TW); Chih-Chiang Chen, Ilan Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/008,848

(22) Filed: Nov. 30, 2001

(65) Prior Publication Data

US 2003/0030080 A1 Feb. 13, 2003

(30) Foreign Application Priority Data

Aug. 8, 2001 (TW) .......................... 90119284 A

(51) Int. Cl.[7] .............................................. H01L 21/00
(52) U.S. Cl. ................. 438/149; 438/151; 438/163; 438/299; 438/592; 438/652
(58) Field of Search ................. 438/149, 151, 438/154, 155, 159, 161, 163, 197, 299, 305, 584, 585, 588, 592, 652, 656, 704, 706, 707, 709, 710, 712, 745; 257/66, 72, 288, 347, 349, 350, 351

(56) References Cited

U.S. PATENT DOCUMENTS 6,329,672 B1 * 12/2001 Lyu et al. ..................... 257/59

FOREIGN PATENT DOCUMENTS

JP 2002-94074 * 3/2002

* cited by examiner

Primary Examiner—Jack Chen
(74) Attorney, Agent, or Firm—Birch, Stewart, Kolasch & Birch, LLP

(57) ABSTRACT

A polysilicon thin film transistor with a self-aligned LDD structure has a polysilicon layer formed on a transparent insulating substrate. The polysilicon layer consists of a channel region, an LDD structure on two sides of the channel region, and a source/drain region on two sides of the LDD structure. A gate insulating layer is formed on the polysilicon layer, a first metal layer is patterned on the gate insulating layer to cover the channel region, and a second metal layer is patterned on the first metal layer to cover the channel region.

5 Claims, 4 Drawing Sheets

METHOD FOR FORMING POLYSILICON THIN FILM TRANSISTOR WITH A SELF-ALIGNED LDD STRUCTURE

BACKGROUND OF THE INVENTION

1. Field of the Invention

The present invention relates to a polysilicon thin film transistor (poly-Si TFT) and, more particularly, to a poly-Si TFT with a self-aligned lightly doped drain (LDD) structure.

2. Description of the Related Art

Polysilicon thin film transistors (poly-Si TFTs) are widely used in active matrix liquid crystal display (AMLCD) applications. One of the major problems of these poly-Si TFTs is the OFF-state leakage current, which causes charge loss in LCDs. Seeking to solve this problem, conventional lightly doped drain (LDD) structures have been used to reduce the electric field at the junction of the drain electrode, thereby reducing the leakage current.

FIGS. 1A and 1B are cross sections showing a conventional method of forming an LDD structure on a poly-Si TFT. As shown in FIG. 1A, a polysilicon layer 12 is formed on a predetermined surface of a transparent insulating substrate 10, and then a gate insulating layer 14 is formed on the polysilicon layer 12. Next, using a patterned photoresist layer 16 as a mask, a heavy ion implantation process is performed to form an $N^+$ doped region 18 on the polysilicon layer 12, and thus the $N^+$ doped region 18 serves as a source/drain region. As shown in FIG. 1B, after removing the patterned photoresist layer 16, a gate layer 20 is patterned on the gate insulating layer 14 to cover a part of the undoped regions of the polysilicon layer 12. Next, using the gate layer 20 as a mask, a light ion implantation process is performed to form an $N^-$ doped region 22 on the undoped region of the polysilicon layer 12. The $N^-$ doped region 22 serves as an LDD structure and the polysilicon layer 12 underlying the gate layer 20 serves as a channel.

However, an extra photo mask is required to expose the photoresist layer 16, and thus an error of alignment, easily caused by the limitation of the exposure technique, may lead to a shift of the LDD structure. This shift of the LDD structure decreases the electrical performance of the poly-Si TFT.

SUMMARY OF THE INVENTION

The present invention provides a poly-Si TFT with a self-aligned LDD structure and a method of forming the same, in which an extra mask is not required to define the pattern of the LDD structure.

The polysilicon thin film transistor with a self-aligned LDD structure has a polysilicon layer formed on a transparent insulating substrate. The polysilicon layer is defined as a channel region, an LDD structure on two sides of the channel region, and a source/drain region on two sides of the LDD structure. A gate insulating layer is formed on the polysilicon layer, a first metal layer is patterned on the gate insulating layer to cover the channel region, and a second metal layer is patterned on the first metal layer to cover the channel region.

The method of forming the polysilicon thin film transistor with the self-aligned LDD structure comprises steps of: (a) providing a transparent insulating substrate with a polysilicon layer formed on the substrate and a gate insulating layer formed on the polysilicon layer; (b) forming a first metal layer, a second metal layer, and a patterned photoresist layer, successively, on the entire surface of the substrate; (c) dry etching to remove the second metal layer and the first metal layer not covered by the patterned photoresist layer; (d) performing a first ion implantation process with the patterned photoresist layer as a mask to form a heavily doped region on the peripheral region of the polysilicon layer; (e) wet etching to remove a part of the peripheral region of the second metal layer so as to expose a part of the peripheral region of the first metal layer; (f) removing the patterned photoresist layer; (g) dry etching to remove the exposed region of the first metal layer so as to level off the sidewalls of the second metal layer and the first metal layer.; and (h) performing a second ion implantation process with the first metal layer and the second metal layer as a mask to form a lightly doped region on the undoped region of the polysilicon layer.

Accordingly, it is a principal object of the invention to provide an undercut structure on the second metal layer to accurately control the position of the LDD structure.

It is another object of the invention to omit an extra photo mask to define the pattern of the LDD structure.

Yet another object of the invention is to prevent the error of alignment easily caused by the limitation of the exposure technique.

It is a further object of the invention to provide the second metal layer to protect the first metal layer.

Still another object of the invention is to provide the second metal layer to reduce resistance.

Another object of the invention is to provide the second metal layer to improve the electrical performance of the poly-Si TFT.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
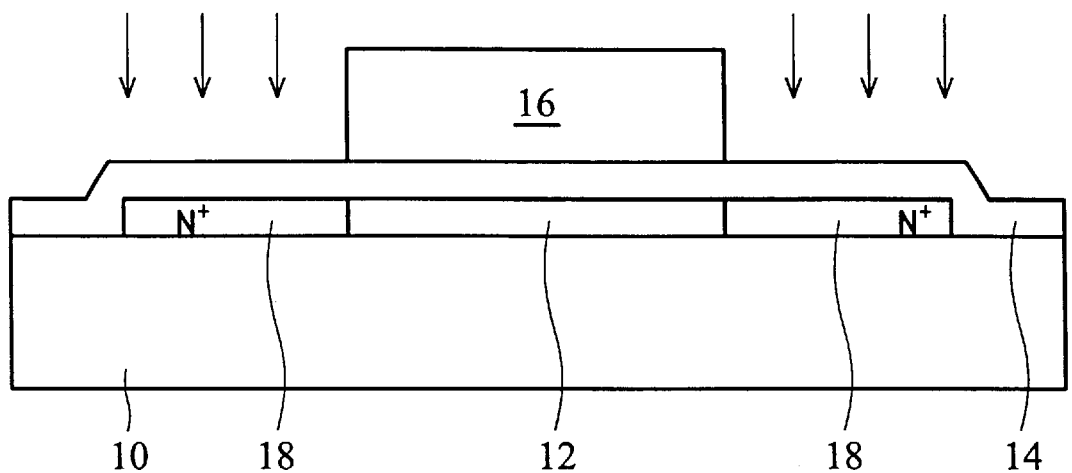
FIGS. 1A and 1B are cross sections showing a conventional method of forming an LDD structure on a poly-Si TFT.
Figure 1B:
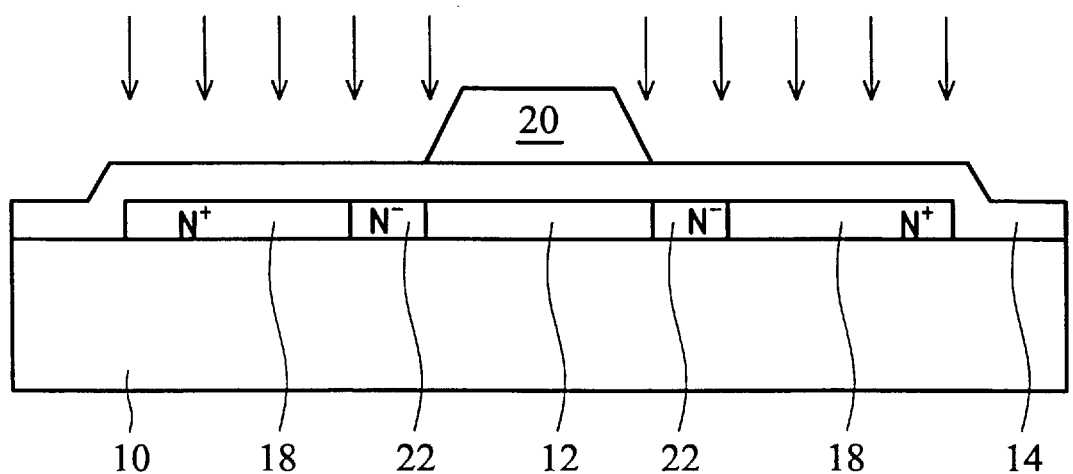
Figure 2A:
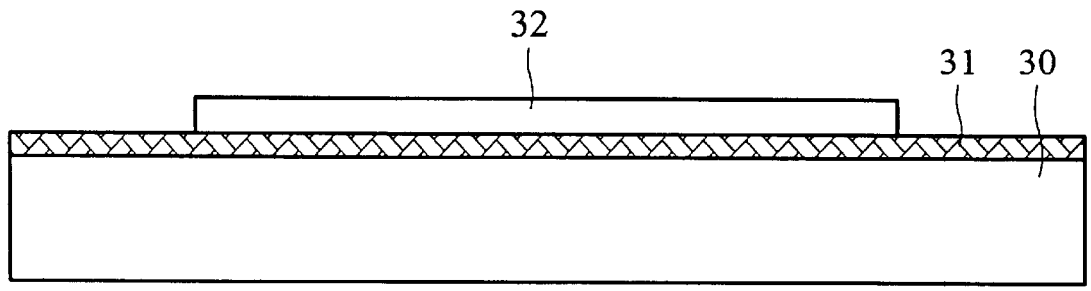
FIGS. 2A to 2E are schematic cross sections showing a method of forming a self-aligned LDD structure of a poly-Si according to the present invention.
Figure 2B:
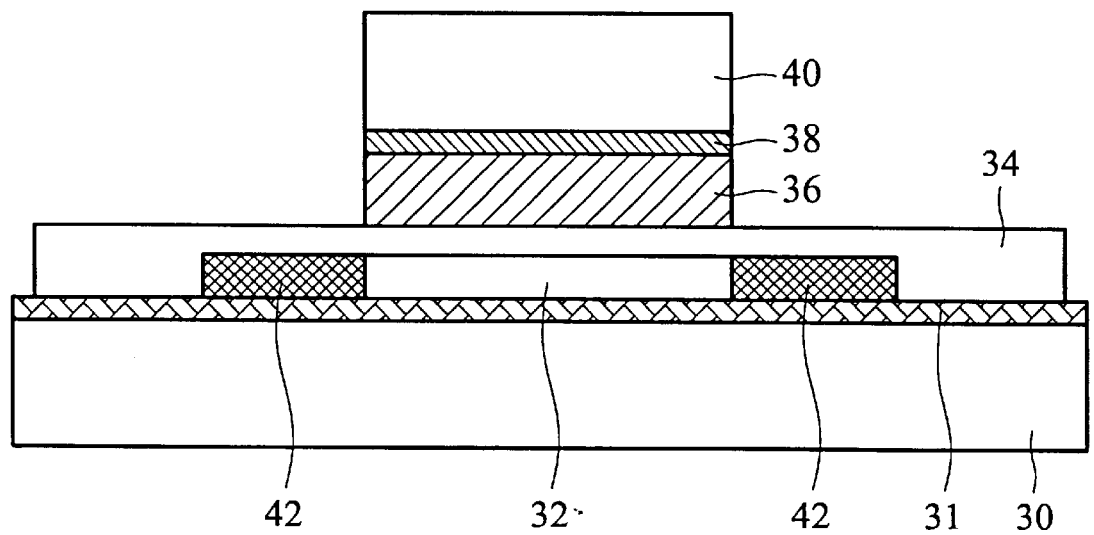

FIGS. 2A to 2E are schematic cross sections showing a method of forming a self-aligned LDD structure of a poly-Si according to the present invention. As shown in FIG. 2A, a transparent insulating substrate 30 is provided with a buffering layer 31 of silicon oxide on the surface, and then a polysilicon layer 32 is patterned on a predetermined area of the buffering layer 31 by deposition and etching wherein the transparent insulating substrate comprises glass. Next, as shown in FIG. 2B, a gate insulating layer 34, a first metal layer 36 and a second metal layer 38 are successively deposited on the exposed surface of the substrate 30, and then a photoresist layer 40 with a pattern of the predetermined source/drain electrode is formed on the second metal layer 38. Preferably, the first metal layer 36 is Mo, MoW or Ti, and the second metal layer 38 of approximately 500 Å thickness is Al, Al—Nd or Cr. Next, using dry etching with the photoresist layer 40 as the mask, the exposed regions of the second metal layer 38 and the first metal layer 36 are removed. Thereafter, fabricating an N-MOS poly-Si TFT for example, a heavy ion implantation process is perform to dope phosphorous (P) ions or arsenic (As) ions with approximately $1\times10^{15}$~$1\times10^{16}$ cm$^{-2}$ doping concentration into the polysilicon layer 32 that is not covered by the first metal layer 36 and the second metal layer 38. Thus, an N$^+$ doped region 42 is formed on the peripheral region of the polysilicon layer 32 to serve as a source/drain region.

Figure 2C:
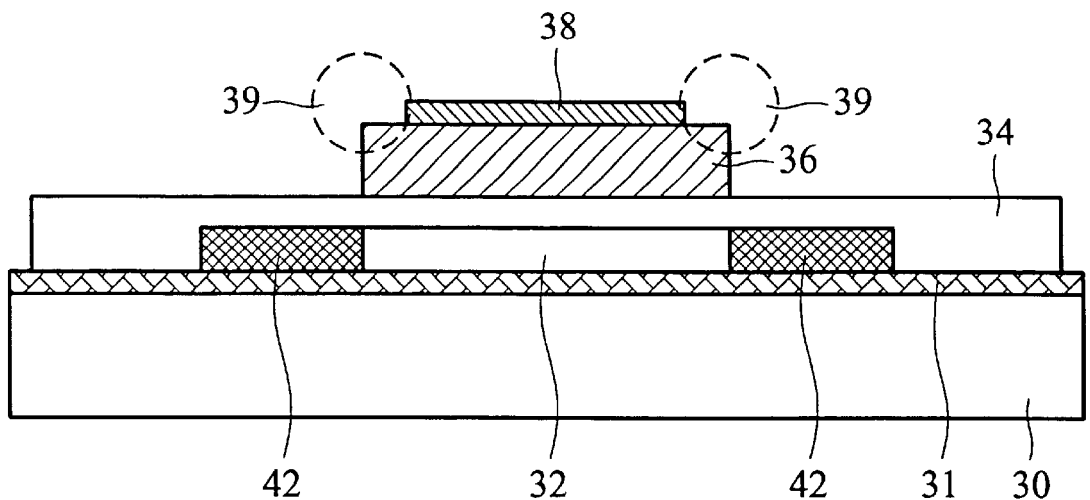
Figure 2D:
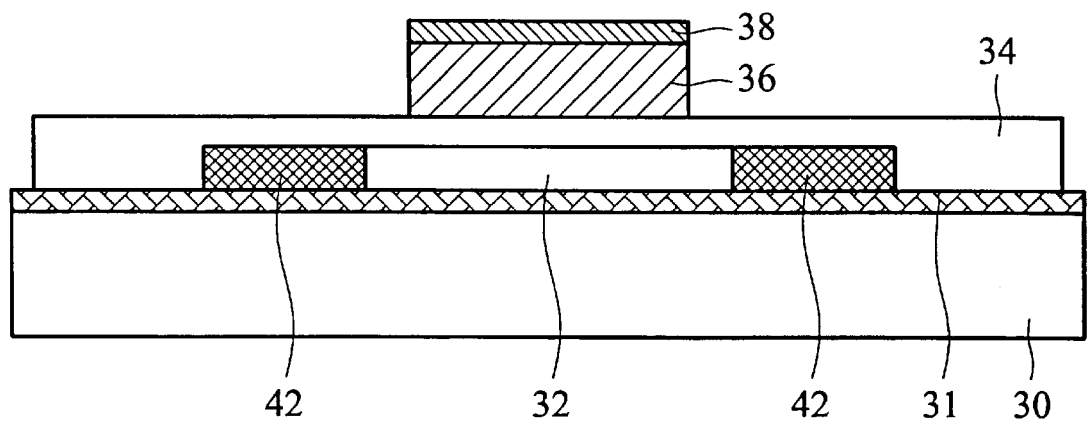
Figure 2E:
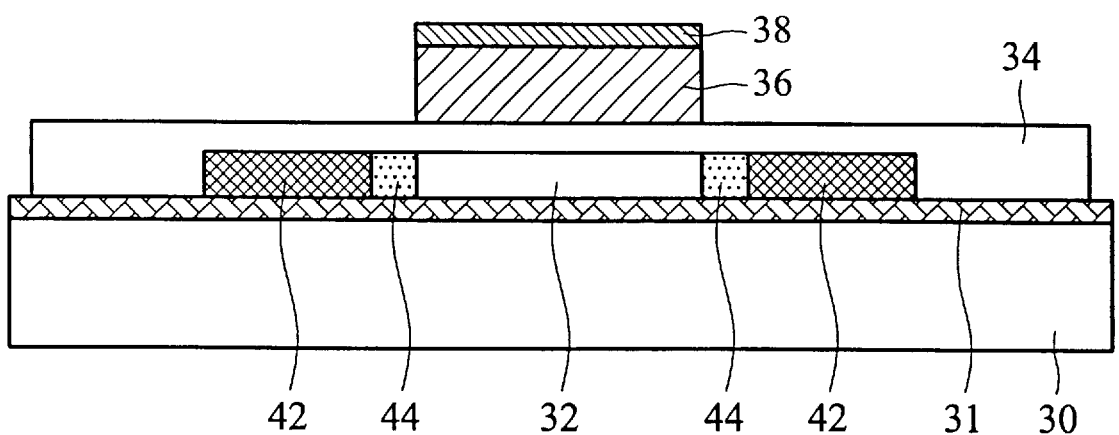

As shown in FIG. 2C, using wet etching to remove the peripheral region of the second metal layer 38, an undercut structure 39 is formed to expose the peripheral region of the first metal layer 36. Then, the photoresist layer 40 is stripped off. Next, as shown in FIG. 2D, using dry etching with the second metal layer 38 as the mask, the exposed region of the first metal layer 36 is removed to level off the sidewalls of the first metal layer 36 and the second metal layer 38. Preferably, the dry etching uses F-based gases, such as SF$_6$ and CF$_4$ to etch the first metal layer. Finally, as shown in FIG. 2E, using the first metal layer 36 and the second metal layer 38 as the mask, a light implantation process is performed to dope phosphorous (P) ions or arsenic (As) ions with approximately $1\times10^{12}$~$1\times10^{14}$ cm$^{-2}$ doping concentration into the polysilicon layer 32. Thereby, an N$^-$ doped region 44 is formed on a part of the undoped region of the polysilicon layer 32 to serve as an LDD structure. Also, the first metal layer 36 and the second metal layer 38 serve as a gate electrode layer, and the undoped region of the polysilicon layer 32 serves as a channel region. Furthermore, the light implantation process can be omitted, thus the region 44 that is undoped serves as an offset structure.

Compared with the prior method of forming the LDD structure, in the method of the present invention, the undercut structure 39 formed by performing wet etching on the second metal layer 38 can accurately control the position of the LDD structure. Since an extra photo mask is not required to define the pattern of the LDD structure, the error of alignment easily caused by the limitation of the exposure technique is prevented. Moreover, the second metal layer 38 can protect the first metal layer 36, and reduce the resistance of the gate electrode layer to improve the electrical performance of the poly-Si TFT.

It is to be understood that the present invention is not limited to the embodiments described above, but encompasses any and all embodiments within the scope of the following claims.

What is claimed is:

1. A method of forming a polysilicon thin film transistor with a self-aligned LDD structure, comprising steps of:
   (a) providing a transparent insulating substrate with a polysilicon layer formed on the substrate and a gate insulating layer formed on the polysilicon layer;
   (b) forming a first metal layer, a second metal layer and a patterned photoresist layer successively on an entire surface of the substrate;
   (c) dry etching to remove the second metal layer and the first metal layer not covered by the patterned photoresist layer;
   (d) performing a first ion implantation process with the patterned photoresist layer as a mask to form a heavily doped region in a peripheral region of the polysilicon layer;
   (e) wet etching to remove a part of a peripheral region of the second metal layer so as to expose a part of a peripheral region of the first metal layer;
   (f) removing the patterned photoresist layer; and
   (g) dry etching to remove the exposed part of the first metal layer so as to level off the sidewalls of the second metal layer and the first metal layer.

2. The method according to claim 1, further comprising a step (h): performing a second ion implantation process with the first metal layer and the second metal layer as a mask to form a lightly doped region in the polysilicon layer.

3. The method according to claim 1, wherein the transparent insulating substrate is glass.

4. The method according to claim 1, wherein the first metal layer is selected from the group consisting of: Mo, MoW, and Ti which can be etched by F-based gases.

5. The method according to claim 1, wherein the second metal layer is selected from the group consisting of: Al, Al—Nd, and Cr.

\* \* \* \* \*